(12) United States Patent
Chen et al.

(10) Patent No.: US 10,480,755 B2
(45) Date of Patent: Nov. 19, 2019

(54) BACK PLATE ASSEMBLY WITH VARIABLE CURVATURES AND BACKLIGHT UNIT THEREOF

(71) Applicant: Shenzhen China Star Optoelectronics Technology Co., Ltd., Shenzhen, Guangdong (CN)

(72) Inventors: Shihhsiang Chen, Guangdong (CN); Dehua Li, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/977,137

(22) Filed: May 11, 2018

(65) Prior Publication Data

US 2018/0259160 A1    Sep. 13, 2018

Related U.S. Application Data

(62) Division of application No. 14/425,093, filed on Mar. 2, 2015, now Pat. No. 10,018,331.

(51) Int. Cl.
| | |
|---|---|
| *G09F 9/30* | (2006.01) |
| *F21V 14/02* | (2006.01) |
| *G02F 1/133* | (2006.01) |
| *H05K 5/02* | (2006.01) |
| *G09F 13/04* | (2006.01) |

(52) U.S. Cl.
CPC ............. *F21V 14/02* (2013.01); *G02F 1/133* (2013.01); *H05K 5/0217* (2013.01)

(58) Field of Classification Search
CPC .......... F21V 14/02; F21V 14/08; G02F 1/133; G09F 9/00; H05K 5/0217
USPC ........................................................ 362/97.1
See application file for complete search history.

(56) References Cited

U.S. PATENT DOCUMENTS

| | | | |
|---|---|---|---|
| 2014/0198465 A1* | 7/2014 | Park ..................... | H05K 5/0226 361/749 |
| 2016/0050772 A1* | 2/2016 | Park ........................ | H04N 5/64 361/807 |

\* cited by examiner

*Primary Examiner* — William J Carter
*Assistant Examiner* — Omar Rojas Cadima
(74) *Attorney, Agent, or Firm* — Andrew C. Cheng

(57) ABSTRACT

A back plate assembly with variable curvatures is disclosed. It comprises a flexible back plate, a connecting component, and an adjustment mechanism, and the adjustment mechanism comprises a connecting shaft disposed on the back plate, and the connecting component connects to the connecting shaft and abuts to the back plate, and the adjustment mechanism adjusts the connecting component on the connecting shaft to modulate clamping force of the back plate received from the connecting component. The back plate assembly can adapt to the backlight units and the display devices with different curvatures based on the requirement of the bend degree. Many kind of the back plate assemblies do not need to be manufactured to fit the backlight unit and the display device having different curvatures.

6 Claims, 3 Drawing Sheets

BACK PLATE ASSEMBLY WITH VARIABLE CURVATURES AND BACKLIGHT UNIT THEREOF

CROSS REFERENCE TO RELATED APPLICATIONS

This is a divisional application of co-pending U.S. patent application Ser. No. 14/425,093, filed on Oct. 15, 2014, which is a national stage of PCT application No. PCT/CN2014/088610, filed on Oct. 15, 2014, claiming foreign priority of Chinese Patent Application No. 201410529231.1, filed on Oct. 9, 2014.

BACKGROUND OF THE INVENTION

1. Field of the Invention

The present invention relates to the display field; in particular, to a backlight assembly and a backlight unit thereof.

2. Description of the Prior Art

With the development of the display technology, major electronic display device and display panel manufacturers gradually purse the curved display technology. The display equipment employs the curved display penal that enable the distance between the whole panel and the viewer's eye to be the same to insure the clarity of the viewer watching the images on the two sides of the panel. At the same time, the viewer easily has an immersive experience when they watch the curved display equipment.

A Nowadays, the two methods of the curved module achieving curved surface of the panel is that one is to use a frame to bend the back plate to form the target curve and then to fix the backlight module; the other one is to form the curved structure of the back plate and then to fix the backlight module. However, the two structures of the back plate cannot achieve the modulation of the curvature of the curved module, only for one single curvature.

SUMMARY OF THE INVENTION

In light of the shortcoming in the conventional art, the present invention provides a backlight assembly with variable curvatures and a backlight unit thereof.
In order to achieve the purpose, the present invention adopts the following technical solution:
A back plate assembly with variable curvatures, comprising a flexible back plate, a connecting component, and an adjustment mechanism, and the adjustment mechanism comprises a connecting shaft disposed on the back plate, and the connecting component connects to the connecting shaft and abuts to the back plate, and the adjustment mechanism adjusts the connecting component on the connecting shaft to modulate clamping force of the back plate received from the connecting component.

Further, the middle portion of the connecting component connects to the connecting shaft and two ends of the connecting component abuts to back side of the back plate, and the adjustment mechanism adjusts position where the middle portion of the connecting component is located on the connecting shaft.

Further, the connecting component comprises two connecting arms, a fixing plate, two moving plates and a moving block, and the fixing plate is set on the connecting shaft to fix on back side of the back plate; the two moving plates are respectively hinged with two opposite side faces of the fixing plate; the moving block is set on the connecting shaft and moves along an axial of the moving plates; one end of the connecting arm is hinged with the moving block and another end of the connecting arm is hinged with the movable plate.

Further, the connecting component comprises two connecting arms and a moving block, and the movable block is set on the connecting shaft and moves along an axial of the moving plates; one end of the connecting arm fixes to the movable block relatively and two of the connecting arms have a certain included angle.

Further, the connecting component further comprises two moving plates, and the two moving plates respectively is fixed slidably to back side of the back plate, and another ends of two of the connecting arms are hinged with the moving plate.

Further, a plurality of elongated slide holes are disposed on the moving plate, and limiting nails penetrate through the elongated slide holes to fix on the back plate, and the moving plate slides relatively to the limiting nails.

Further, one end of the connecting shaft is attached rotatably to the back plate, and another end of the connecting shaft is attached to a thread of the moving block, and the adjustment mechanism further comprises a driven module connecting to the connecting shaft, and the driven module powers the connecting shaft turning to move the moving block along an axial of the connecting shaft.

Further, the driven mechanism comprises a driving gear, and a driven gear is disposed on the connecting shaft, and the driven mechanism drives the driven gear rotating.

A backlight unit, comprising a backlight module and a back plate assembly with variable curvatures, the back plate assembly comprises a flexible back plate, a connecting component, and an adjustment mechanism, and the adjustment mechanism comprises a connecting shaft disposed on the back plate, and the connecting component connects to the connecting shaft and abuts to the back plate, and the adjustment mechanism adjusts the connecting component on the connecting shaft to modulate clamping force of the back plate received from the connecting component.

Further, the middle portion of the connecting component connects to the connecting shaft and two ends of the connecting component abuts to back side of the back plate, and the adjustment mechanism adjusts position where the middle portion of the connecting component is located on the connecting shaft.

Further, the connecting component comprises two connecting arms, a fixing plate, two moving plates and a moving block, and the fixing plate is set on the connecting shaft to fix on back side of the back plate; the two moving plates are respectively hinged with two opposite side faces of the fixing plate; the moving block is set on the connecting shaft and moves along an axial of the moving plates; one end of the connecting arm is hinged with the moving block and another end of the connecting arm is hinged with the movable plate.

Further, the connecting component comprises two connecting arms and a moving block, and the movable block is set on the connecting shaft and moves along an axial of the moving plates; one end of the connecting arm fixes to the movable block relatively and two of the connecting arms have a certain included angle.

Further, the connecting component further comprises two moving plates, and the two moving plates respectively is fixed slidably to back side of the back plate, and another ends of two of the connecting arms are hinged with the moving plate.

Further, a plurality of elongated slide holes are disposed on the moving plate, and limiting nails penetrate through the elongated slide holes to fix on the back plate, and the moving plate slides relatively to the limiting nails.

Further, one end of the connecting shaft is attached rotatably to the back plate and another end of the connecting shaft is attached to a thread of the moving block, and the adjustment mechanism further comprises a driven module connecting to the connecting shaft, and the driven module powers the connecting shaft turning to move the moving block along an axial of the connecting shaft.

Further, the driven mechanism comprises a driving gear, and a driven gear is disposed on the connecting shaft, and the driven mechanism drives the driven gear rotating.

DETAILED DESCRIPTION OF THE PREFERRED EMBODIMENTS

In order to understand the present invention well, the following examples combining with the accompanying drawings in detail.

1st Embodiment

Figure 1:
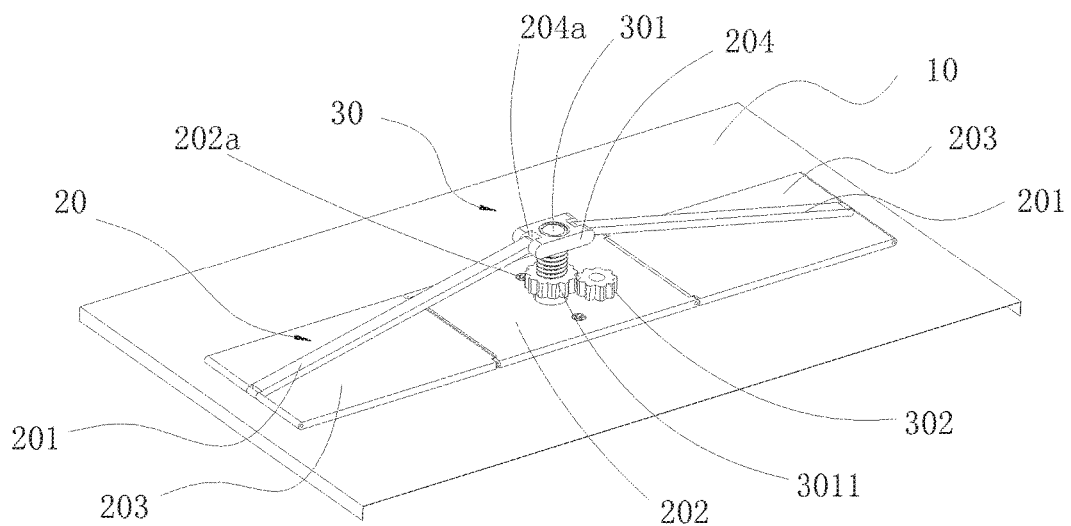
FIG. 1 is the schematic diagram of the flat state back plate of the back plate assembly of the first embodiment of the present invention.

Please refer to FIG. 1. The embodiment of the present invention provides a back plate with variable curvatures used to fix a backlight module having a light guide structure such as a light guide plate and an optical film. It comprises a flexible back plate 10, a connecting component 20 and an adjustment mechanism 30. The adjustment mechanism 30 comprises a connecting shaft 301 disposed on the back plate 10, and the middle portion of the connecting component 20 attaches to the connecting shaft 301, and the two ends of the connecting component 20 abuts to the back side of the back plate 10. The adjustment mechanism 30 adjusts the position on the connecting shaft 301 and in the medium of the connecting component 20 to control the clamping force of the two ends of the connecting component 20 and to change the bending degree of the back plate 10.

Specifically, the connecting component 20 comprises two connecting arms 201, a fixing plate 202, two moving plates 203 and a moving block 204. The fixing plate 202 is set on the connecting shaft 301 and fixed on the back side of the connecting shaft 301. The fixing plate 202 is disposed on the back plate 10 by two fixing screws. The two moving plates 203 can be respectively hinged with two opposite side faces of the fixing plate 202 to fix the two moving plates 203 to the sides of the fixing plate 202 slidably. The moving block 204 is set on the connecting shaft 301 and moves along an axial of the moving plates. One end of each of the connecting arms 201 is hinged to the moving block 204, and the other end is hinged to the moving plate 203.

A pin is used to connect slidably between the two moving plates 203 and the fixing plate 203, between the moving plates 203 and the two connecting arms 201, and between the two connecting arms 201 and the moving block 204. The connecting structure is simple and reliable. Specifically, the moving block 204 comprises grooves 204a and a central hole (not shown in figures). One end of the connecting arm 201 embeds into the groove 204a and then the shaft is positioned by the pin. The connecting arm 201 can be rotated relatively to the moving block 204 and the central hole of the moving block 204 is used to be penetrated by the connecting shaft 301. Similarly, the other groove (not shown in figures) is disposed on the moving plate 203 connecting to the connecting arm 201 rotatably. The other end of the connecting arm 201 is embedded into the other notch and then the shaft is positioned by the pin.

Figure 2:
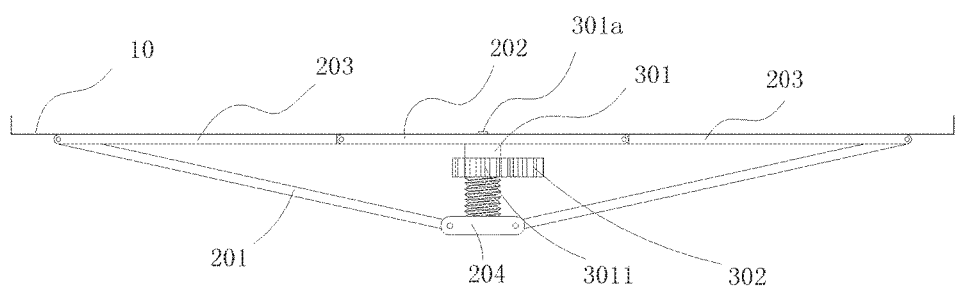
FIG. 2 is the schematic diagram of FIG. 1 in the main view direction
Figure 3:
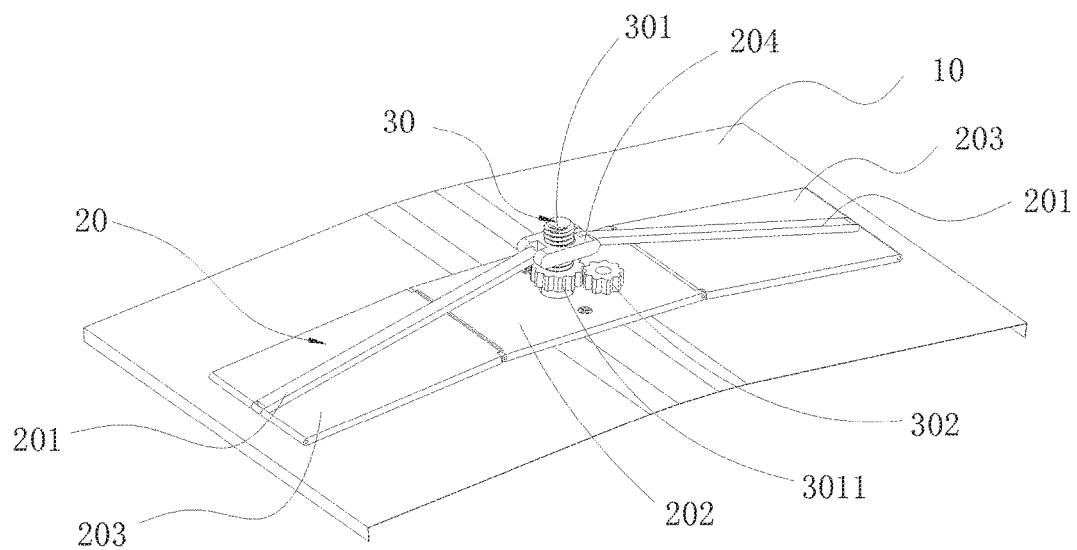
FIG. 3 is the schematic diagram of the curved state back plate of the back plate assembly of the first embodiment of the present invention.
Figure 4:
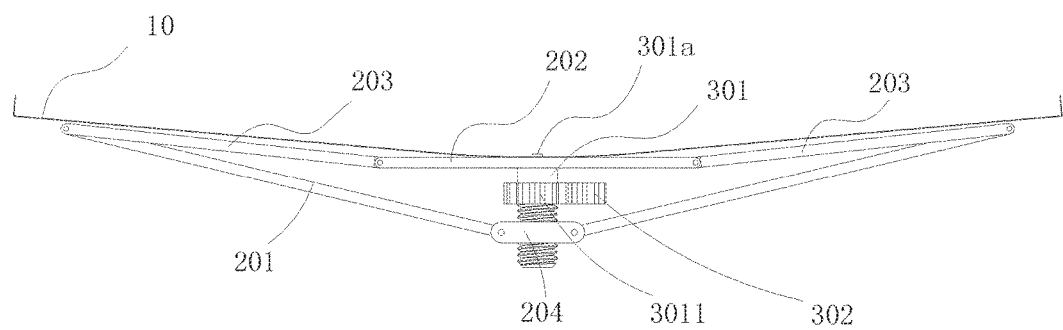
FIG. 4 is the schematic diagram of FIG. 3 in the main view direction

As shown in FIG. 2, FIG. 3, and FIG. 4, one end of the connecting shaft 301 is rotatable connected to the back plate 10, and the other end of the connecting shaft 301 is connected to the thread of the moving block 204, i.e. the central hole of the moving block 204 has an inner thread. The adjustment mechanism 30 further comprises a driven mechanism 302 connecting to the connecting shaft 301. The driven mechanism 302 is used for rotating the driven mechanism 301 to move the moving block 204 along the axial direction of the connecting shaft 301. Specifically, the connecting shaft 301 is positioned on the back plate 10 by the connecting component 301a to make the connecting shaft 301 rotate on the back plate 10 without escaping.

The driven mechanism 302 of the first embodiment employs a gear to rotate and the driven mechanism 302 drives by the gear hereto. The connecting shaft 301 connects with a driven gear 3011. The power source of the driven mechanism 302 is the rotation of the driven gear 3011.

It can be understood that the driven mechanism 302 of the first embodiment can be other driven mechanism, such as a belt transmission structure, a worm and gear structure and so on In practice, when to change the shape of the back plate demands the specific curvature, the driven mechanism 302 drives the connecting shaft 301 relatively to the back plate 10 such that the moving block 204 moves toward the back plate 10. Because the fixing plate 202 does not move around, the moving block 204 drives the connecting arm 201 and the two sides of the moving plate 203 rotating, and then the included angles between the connecting arm 201 and the back plate 10 and between the moving plate 203 and the back plate 10 gradually decrease to press the two side of the back plate 10 and bend the back plate with the specific curvature. When the flat shape of the back plate is demanded, the driven mechanism 302 drives the connecting shaft 301 rotating with the opposite direction. The pressure of the back plate from the connecting arm 201 and two sides of the moving plate 203 gradually decreases until it return to the flat shape.

The backlight unit of the present invention comprises a backlight module and a back plate assembly. Because the back plate assembly requires the curvature modulation according to the backlight module, it solves a problem that one single back plate cannot adapt to many kinds of the backlight unit in the manufacture process, and it reduces the amount of the share part and the manufacture cost.

2nd Embodiment

Figure 5:
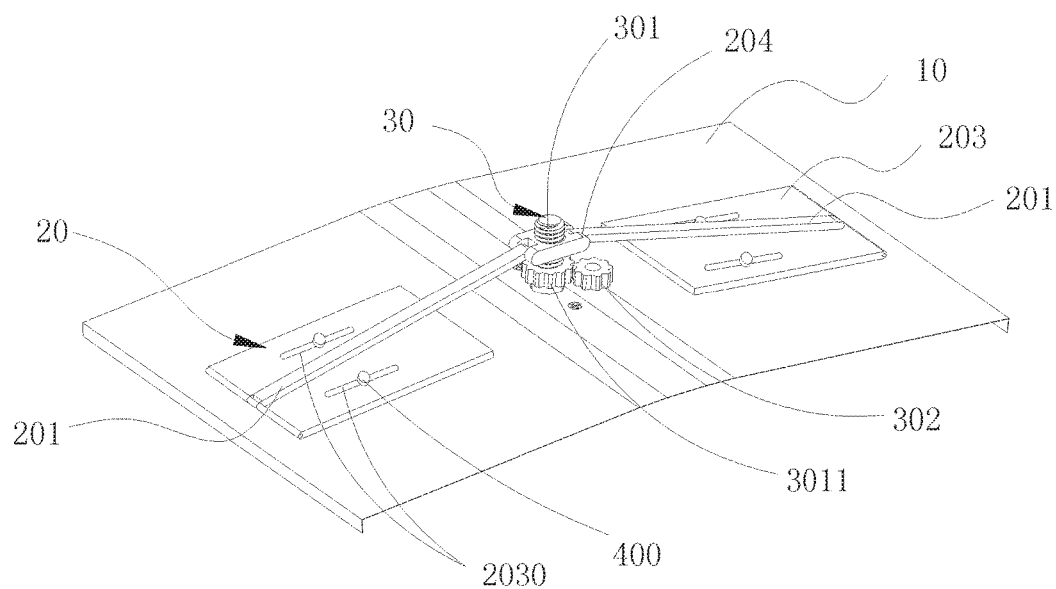
FIG. 5 is the schematic diagram of the curved state back plate of the back plate assembly of the second embodiment of the present invention.
Figure 6:
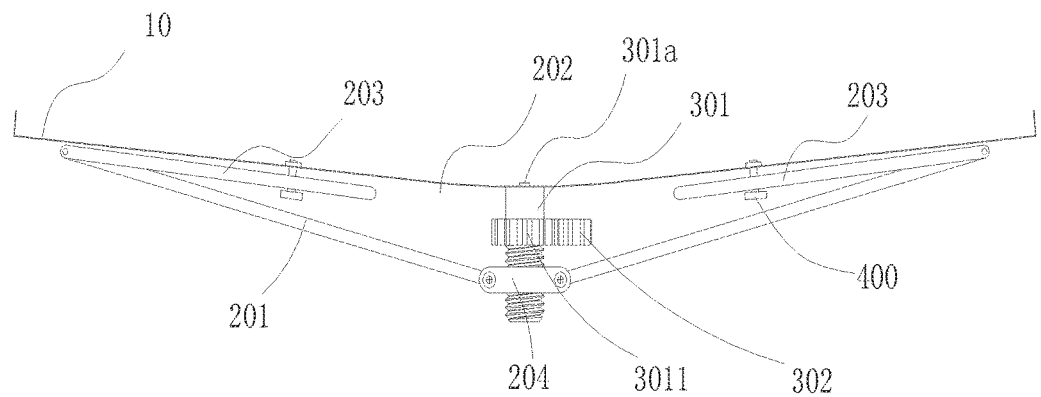
FIG. 6 is the schematic diagram of FIG. 5 in the main view direction

As shown in FIG. 5 and FIG. 6, the difference from the first embodiment is that the connecting component 20 of the back plate assembly of the second embodiment comprises two connecting arms 201 and moving block 204, where the moving block 204 is set on the connecting shaft 301 and moves along the axial direction of the connecting shaft 301. One end of the connecting arms 201 is fixed relatively to the moving block 204, and the two connecting arms 201 have a fixed included angle. The end of the connecting shaft 301 is rotatable attached to the back plate 10, and the other end of the connecting shaft 301 is connected to the thread of the moving block 204. The moving block 204 moves on the connecting shaft 301 and drives the two connecting arms 201 to press the back plate 10 to form distortion. Further, the connecting component 20 of the present embodiment further comprises two moving plates 203 and the two moving plates 203 are respectively and slid ably fixed on the back side of the back plate and at the same time are hinged to the other end of the two connecting arm 201 respectively; the moving block 204 moves on the connecting shaft 301 and at the same time drives the two moving plates 203 by the two connecting arms 201 to press the back plate 10 to form distortion. The back plate 10 is pressed more uniformly to form the curvature more smoothly. In the first embodiment, the connecting arm 201 is attached with the moving block 204 by the screw to ensure that the included angle between the two connecting arms 201 is constant. It can be understood that the two connecting arm 201 and the moving block 204 can be formed in one piece as well.

Specifically, a plurality of elongated slide holes 2030 are disposed on the moving plate 203, and limiting nails 400 penetrate through the slide holes 2030 to fix on the back plate 10. The moving plate 203 slides relatively to the limiting nails. Specifically, the limiting nails 400 are screws comprising nuts (not shown in figures) and threaded ends (not shown in figures). The limiting nails 400 penetrates through the elongated slide holes 2030 on the moving plate 203 and the threaded ends is fixed on the back plate 10. The moving plate 203 is positioned by the nuts to prevent the moving plate 203 on escaping. The slide holes 2030 of the moving plate 203 slide along the limiting nails 400. It can be understood that the amount of the slide holes 2030 and the amount of the limiting nails 400 are designed based on the practical requirement for leading the moving plate 203 to slide relatively to the back plate 10 without escaping in the second embodiment.

In practice, when to change the shape of the back plate demands the specific curvature, the driven mechanism 302 drives the connecting shaft 301 relatively to the back plate 10 such that the moving block 204 moves toward the back plate 10. Because the two connecting arms 201 is attached to the moving block 204 relatively, the two connecting arms 201 moves with the moving block 204 toward the back plate 10 such that they drives the moving plate 204 to press the back plate 10. During the process of pressing the back plate, the curvature of the back plate 10 becomes large and the limit nail 400 slides toward the slide holes 2030 and closely to the end of the connecting shaft 301 such that the two sides of the back plate 10 is pressed to bend the back plate 10 with the specific curvature. When the flat shape of the back plate 10 is demanded, the driven mechanism 302 drives the connecting shaft 301 rotating with the opposite direction. The pressure of the back plate 10 from the connecting arm 201 and two sides of the moving plate 203 gradually decreases until it return to the flat shape.

The above are only specific embodiments of the present invention, it should be noted that those of ordinary skill in the art, in the present invention without departing from the principles of the premise, further improvements and modifications may be made, these improvements and modifications should also be regarded as the protection scope of the present invention.

What is claimed is:

1. A back plate assembly with variable curvatures, comprising a flexible back plate, a connecting component, and an adjustment mechanism, wherein the adjustment mechanism comprises a connecting shaft disposed on the flexible back plate, and the connecting component is coupled to the connecting shaft and abuts the flexible back plate, and the adjustment mechanism adjusts the connecting component on the connecting shaft to modulate a clamping force of the flexible back plate received from the connecting component;

wherein a middle portion of the connecting component is coupled to the connecting shaft and two ends of the connecting component abuts to abut a back side of the flexible back plate, and the adjustment mechanism adjusts a position where the middle portion of the connecting component is located on the connecting shaft;

wherein the connecting component comprises two connecting arms and a moving block, wherein the moving block is set on the connecting shaft and is movable along an axis of the connecting shaft; and each of the two connecting arms has a first end that is coupled to the moving block such that the two connecting arms define an included angle; and wherein the connecting shaft has a proximal end that is rotatably and directly mounted to the back side of the flexible back plate and an opposite, distal end that is in threading engagement with the moving block, and the adjustment mechanism comprises a driven module connecting to the connecting shaft and powering the connecting shaft to rotate so as to cause a movement of the moving block along the axis of the connecting shaft through the threading engagement between the distal end of the connecting shaft and the moving block, wherein the driven module is arranged between the back side of the flexible back plate and the moving block, such that the flexible back plate, the driven module, and the moving block are arranged in such an order in a direction defined by the axis of the connecting shaft and the driven module and the moving block are both arranged backward of the back side of the flexible back plate.

2. The back plate assembly as claimed in claim 1, wherein the connecting component further comprises two moving plates, each of which is slidably coupled to the back side of the flexible back plate; and each of the two connecting arms has a second end, and the second ends of the two connecting arms are respectively hinged with the two moving plates.

3. The back plate assembly as claimed in claim 1, wherein a plurality of elongated slide holes are disposed on each of the two moving plates, and limiting nails that penetrate through the elongated slide holes are fixed to the back plate, so that the two moving plates are slidable relative to the limiting nails.

4. A backlight unit, comprising a backlight module and a back plate component with variable curvatures, the back plate comprising a flexible back plate, a connecting component, and an adjustment mechanism, wherein the adjustment mechanism comprises a connecting shaft disposed on the flexible back plate, and the connecting component is coupled to the connecting shaft and abuts the flexible back plate, and the adjustment mechanism adjusts the connecting component on the connecting shaft to modulate a clamping force of the flexible back plate received from the connecting component;

wherein a middle portion of the connecting component is coupled to the connecting shaft and two ends of the connecting component abut a back side of the flexible back plate, and the adjustment mechanism adjusts a position where the middle portion of the connecting component is located on the connecting shaft;

wherein the connecting component comprises two connecting arms and a moving block, wherein the moving block is set on the connecting shaft and is movable along an axis of the connecting shaft; and each of the two connecting arms has a first end that is coupled to the moving block such that the two connecting arms define an included angle; and wherein the connecting shaft has a proximal end that is rotatably and directly mounted to the back side of the flexible back plate and an opposite, distal end that is in threading engagement with the moving block, and the adjustment mechanism comprises a driven module connecting to the connecting shaft and powering the connecting shaft to rotate so as to cause a movement of the moving block along the axis of the connecting shaft through the threading engagement between the distal end of the connecting shaft and the moving block, wherein the driven module is arranged between the back side of the flexible back plate and the moving block, such that the flexible back plate, the driven module, and the moving block are arranged in such an order in a direction defined by the axis of the connecting shaft and the driven module and the moving block are both arranged backward of the back side of the flexible back plate.

5. The backlight unit as claimed in claim 4, wherein the connecting component further comprises two moving plates, each of which is slidably coupled to the back side of the flexible back plate; and each of the two connecting arms has a second end, and the second ends of the two connecting arms are respectively hinged with the two moving plates.

6. The backlight unit as claimed in claim 4, wherein a plurality of elongated slide holes are disposed on each of the two moving plates, and limiting nails that penetrate through the elongated slide holes are fixed to the back plate, so that the two moving plates are slidable relative to the limiting nails.

* * * * *